United States Patent
Schaefer et al.

(10) Patent No.: US 11,502,759 B2
(45) Date of Patent: Nov. 15, 2022

(54) CIRCUITRY DISTORTION CORRECTOR, MEASUREMENT DEVICE, CORRECTION DATA GENERATOR, AND CORRECTION METHOD

(71) Applicant: ROHDE & SCHWARZ GMBH & CO. KG, Munich (DE)

(72) Inventors: Andrew Schaefer, Oberhaching (DE); Andreas Ziegler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 46 days.

(21) Appl. No.: 17/126,422

(22) Filed: Dec. 18, 2020

(65) Prior Publication Data

US 2022/0200706 A1 Jun. 23, 2022

(51) Int. Cl.
*H04B 17/00* (2015.01)
*G01R 31/28* (2006.01)
*H04B 15/00* (2006.01)
*H04B 1/16* (2006.01)

(52) U.S. Cl.
CPC ......... *H04B 17/00* (2013.01); *G01R 31/2822* (2013.01); *H04B 1/16* (2013.01); *H04B 15/00* (2013.01)

(58) Field of Classification Search
CPC .......... H04B 17/00; H04B 1/16; H04B 15/00; G01R 31/2822
See application file for complete search history.

(56) References Cited

U.S. PATENT DOCUMENTS

| | | | | | |
|---|---|---|---|---|---|
| 5,881,091 | A * | 3/1999 | Bartz | .............. | H04B 1/12 375/285 |
| 6,316,945 | B1 * | 11/2001 | Kapetanic | .............. | G01R 23/20 324/650 |
| 6,804,313 | B2 * | 10/2004 | Skafidas | .............. | H04L 25/03076 708/320 |
| 7,035,361 | B2 * | 4/2006 | Kim | .............. | H04L 25/03076 375/348 |
| 2003/0222652 | A1 * | 12/2003 | Martens | .............. | G01R 23/20 324/520 |
| 2015/0160279 | A1 * | 6/2015 | Zhou | .............. | H03F 3/189 324/626 |
| 2018/0026816 | A1 | 1/2018 | Pickerd et al. | | |

FOREIGN PATENT DOCUMENTS

| | | | | | |
|---|---|---|---|---|---|
| DE | 112011105345 T5 * | 4/2014 | ....... | H04L 25/03159 |
| SU | 1234976 A1 * | 5/1986 | | |

* cited by examiner

*Primary Examiner* — Jean B Corrielus
(74) *Attorney, Agent, or Firm* — Brooks Kushman P.C.

(57) ABSTRACT

The present disclosure provides a circuitry distortion corrector for correcting distortions of electrical signals. The circuitry distortion corrector comprises a first correction filter that filters the received signals, and a second correction filter that is coupled to the first correction filter and filters the signals that are filtered by the first correction filter. The first correction filter operates based on first filter coefficients that are based on first value tuples, each first value tuple comprising a first frequency and a respective first circuitry characterizing value, and wherein the first frequencies are equally spaced apart, and the second correction filter operates with second filter coefficients that are based on second value tuples, each second value tuple comprising a second frequency and a respective second circuitry characterizing value, wherein the second frequencies are logarithmically spaced apart.

24 Claims, 8 Drawing Sheets

CIRCUITRY DISTORTION CORRECTOR, MEASUREMENT DEVICE, CORRECTION DATA GENERATOR, AND CORRECTION METHOD

TECHNICAL FIELD

The disclosure relates to a circuitry distortion corrector, a respective measurement device, a respective correction data generator, and a respective correction method.

BACKGROUND

Although applicable to any electrical circuitry, the present disclosure will mainly be described in conjunction with the input circuitry of oscilloscopes.

Electrical circuitry comprises electrical characteristics that may change or modify signals traveling through the electrical circuitry. While in some applications such a change in the signal is wanted like, e.g., in audio crossovers, in other applications the signals should be transmitted with as little changes or distortions as possible.

This is especially the case for measuring equipment, where the signal to be measured should be provided from the device under test to the measurement device with as few changes or distortions as possible.

Accordingly, there is a need for improving signal transmission to measurement devices.

SUMMARY

The above stated problem is solved by the features of the independent claims. It is understood, that independent claims of a claim category may be formed in analogy to the dependent claims of another claim category.

Accordingly, it is provided: A circuitry distortion corrector for correcting distortions of signals in electrical circuitry, the circuitry distortion corrector comprising a signal input that receives the signals, a first correction filter that is coupled to the signal input and that filters the received signals; and a second correction filter that is coupled to the first correction filter and filters the signals that are filtered by the first correction filter; wherein the first correction filter operates based on first filter coefficients that are based on first value tuples, each first value tuple comprising a first frequency and a respective first circuitry characterizing value, wherein the first frequencies are equally spaced apart; and wherein the second correction filter operates with second filter coefficients that are based on second value tuples, each second value tuple comprising a second frequency and a respective second circuitry characterizing value, wherein the second frequencies are logarithmically spaced apart.

Further, it is provided: A measurement device for measuring signals in a device under test, the measurement device comprising a signal input interface that is couplable to a measurement circuitry for coupling to the device under test; and a circuitry distortion corrector that is coupled to the signal input interface to correct distortions introduced by the measurement circuitry into the signal to be measured.

Further, it is provided: A correction data generator for generating correction data for use with a circuitry distortion corrector according to the present disclosure, the correction data generator comprising a measurement device, a measurement circuitry that is coupled on a first end to the measurement device for coupling on a second end to a device under test, and a signal generator that is coupled to the second end of the measurement circuitry, wherein the signal generator provides a predetermined signal to the measurement circuitry and the measurement device measures the resulting signal at the first end of the measurement circuitry, and wherein the measurement device determines first value tuples comprising a first frequency and a respective first circuitry characterizing value, and second value tuples comprising a second frequency and a respective second circuitry characterizing value, wherein the first frequencies are equally spaced apart, and wherein the second frequencies are logarithmically spaced apart.

Further, it is provided: A correction method for correcting distortions of signals in electrical circuitry, the correction method comprising receiving the signals, filtering with a first correction filter the received signals based on first filter coefficients that are based on first value tuples, each first value tuple comprising a first frequency and a respective first circuitry characterizing value, wherein the first frequencies are equally spaced apart, and filtering with a second correction filter the signals filtered with the first correction filter based on second filter coefficients that are based on second value tuples, each second value tuple comprising a second frequency and a respective second circuitry characterizing value, wherein the second frequencies are logarithmically spaced apart.

The present disclosure is based on the finding that implementing de-embedding functions in e.g., oscilloscopes, requires huge amounts of computational resources e.g., for storing the relevant data and executing the respective filters.

De-embedding in this regard refers to the process of correcting any modifications of, changes of, or influences in a signal that is to be measured in a device under test and that are introduced by the signal path without being part of the original signal. Such changes may be introduced e.g., by capacitances and inductivities in the signal path, which may have a filtering effect on the signal.

Consequently, de-embedding is performed to reverse or eliminate such effects. De-embedding may be performed e.g., with digital filters that may easily be adapted to different signal chains.

For example, when using FIR filters for performing a de-embedding of input signals in an oscilloscope, the size of the memory and the computational power required to calculate the filter coefficients of the FIR filter depends on the number of circuitry characterizing values that are provided for calculating the filter coefficients of the FIR filter.

Further, there is a difference in when or where in the signal chain the de-embedding is performed. De-embedding may be performed e.g., in software after acquiring and storing the signals. In this case, the computational resources are not a limiting factor, because the signals are already acquired and stored. However, if de-embedding is performed in software, the de-embedding is applied after other steps in the signal chain and the resulting de-embedded signal may not match other measurement parameters any more. For example, if a trigger is used for signal acquisition, the trigger may either be determined based on the analog waveforms or the digitized waveform data prior to recording any signal. If de-embedding is performed after recording the data, the trigger may not match the resulting de-embedded data anymore and the analysis of the data may be difficult. The de-embedding may therefore be performed prior to triggering in the respective measurement device.

From the above, it can be seen that de-embedding in the full relevant frequency range prior to performing further actions, like e.g., triggering, may be advantageous.

To this end, the circuitry distortion corrector comprises a first correction filter and a second correction filter. Both filters each operate based on filter coefficients that are based on respective value tuples. Each one of the value tuples comprises a frequency and a respective value that characterizes the respective circuit. In this regard, the "circuit" refers to the signal chain that is to be de-embedded.

The first correction filter operates on filter coefficients that are based on first value tuples. The frequencies in the first value tuples are equally spaced apart. Exemplary frequencies may comprise e.g., 0.5 GHz, 1.0 GHz, 1.5 GHz, 1.5 GHz, and so on.

The second correction filter operates on filter coefficients that are based on second value tuples. The frequencies in the second value tuples are logarithmically spaced apart. Exemplary frequencies may comprise e.g., 1 kHz, 2 kHz, 5 kHz, 10 kHz, 20 kHz, 50 kHz, and so on, or 1 Hz, 10 Hz, 100 Hz, 1000 Hz, and so on. It is noted that other logarithmic resolutions or frequency sequences are also possible.

The first correction filter may also be called the HF (High Frequency) correction filter in this regard, and the second correction filter may be called the LF (Low Frequency) correction filter in this regard. In an exemplary embodiment, the first correction filter may be based on FIR filters. The second correction filter in contrast may be based on IIR filters.

The circuitry distortion corrector provides two different filters that operate on different frequency ranges and use two different spacing or distance systems for the frequencies in the value tuples.

The first correction filter allows performing a de-embedding in the higher frequency range with a filter that uses filter coefficients that are based on the first value tuples i.e., on equally distanced frequencies. The higher or HF frequency range may start e.g., at 50 MHz, 100 MHz, 150 MHz, 200 MHz or more and range up to multiple GHz. The lower or LF frequency range may range e.g., from 0 Hz to 100 MHz, 150 MHz, or 200 MHz and range up to 50 MHz, 100 MHz, 150 MHz, 200 MHz, 250 MHz, 300 MHz, 350 MHz or more. It is understood, that the above frequencies are just exemplary frequencies and that other frequencies are possible.

The second correction filter may operate in the lower frequency range, and as explained above may use one or more IIR filters. The slow decay factors of IIR filters can be beneficially used to correct distortions in the LF frequency range. It is understood, that the second correction filter may comprise more than one IIR filter, e.g., two or more IIR filters arranged in parallel, and may also comprise FIR filters together with one or more IIR filters.

If the filter coefficients of the second correction filter are calculated based on logarithmically spaced frequencies and respective circuitry characterizing values, only a small number of value tuples will be required for the respective frequency band.

For example, only 10 values may be required to cover a LF frequency range from 1 kHz to 100 MHz. If the second value tuples in contrast would comprise linearly spaced apart frequencies every 1 kHz, 100000 value tuples would be required. It would still be possible to calculate the filter coefficients of the second correction filter from the linear spaced value tuples. However, this would unnecessarily increase the required memory and the computational time, while most of the information in the set of the linear spaced value tuples would be redundant.

In an embodiment, the logarithmically spaced frequencies and respective circuitry characterizing values may be provided with linearly spaced frequencies, but with respective weights. The weights may be chosen such that the value tuples with frequencies that are logarithmically spaced are weighted stronger than the other value tuples. Respective weights may comprise e.g., 1 and 0. Other weights are also possible.

With the circuitry distortion corrector, it is possible to efficiently filter a signal in the LF frequency range and in the HF frequency range. Therefore, the de-embedding, which requires the filtering, may be performed for the LF frequency range and the HF frequency range. Instead of only de-embedding in the HF frequency range, the circuitry distortion corrector also eliminates undesired long-term distortions or errors in the signal that is also de-embedded in the HF frequency range, which would otherwise be particularly obvious in the time-based waveform display of the signals.

Since with the circuitry distortion corrector it is now possible to de-embed a signal path in the full frequency spectrum easily, the de-embedding may be performed prior to providing the signals to be measured e.g., to the trigger mechanism of the measurement device. Performing complex measurement tasks, which require exact triggering may therefore easily be performed with measurement devices that comprise a circuitry distortion corrector according to the present disclosure.

The de-embedding may with the circuitry distortion corrector be performed in real-time before samples are actually acquired e.g., in an acquisition memory. The real-time de-embedding may be performed especially in the data acquisition section of the measurement device. This allows very fast de-embedding. However, the first correction filter may be short in order to not delay the signal much. The second correction filter as indicated before may be based on one or more IIR filters. This allows performing LF de-embedding in the data acquisition section of the measurement device in real time. Since the second correction filter may be in a steady stated, no acquired samples are discarded.

In case that a HF de-embedding with longer FIR filters is required, HF de-embedding may alternatively or in addition be performed in post-processing with the first correction filter. It is obvious, that the first correction filter may be provided as distributed filter in this embodiment, with filter functions in the data acquisition section of the measurement device and with filter functions in the post-processing section of the measurement device.

The LF de-embedding may in an embodiment also be performed at least in part in the post-processing section of the measurement device. In such an embodiment, a respective number of samples may be discarded to receive a long transient response of the second correction filter.

In an embodiment, the measurement device may e.g., be an oscilloscope that is used to perform signal measurements in a device under test. Such an oscilloscope may comprise a signal input interface that may be coupled via a cable to a measurement probe. The measurement probe may be coupled directly or via an adaptor or interposer indirectly to a device under test.

The measurement device comprises a circuitry distortion corrector for correcting any influences on the signals that are caused by the signal path from the device under test to the measurement device e.g., by the measurement probe and the cable, and if present by the interposer.

In order to provide the correct parameters i.e., value tuples, for the respective application, the correction data generator may be used. The correction data generator determines the first and second value tuples by injecting a predetermined signal, also called test signal, into the signal path of the measurement probe and cable, and if present the interposer, on that end that couples to the device under test.

The measurement device measures the resulting signal at the other end of the signal path and determines the value tuples as required in the respective application.

It is understood, that the correction data generator may also be provided in the measurement device. Measurement devices may comprise the required elements, like the signal generator and the respective interfaces. It is understood, that in such a measurement device, the function of the correction data generator may be provided as an additional computer program product or function in a computer program product of the measurement device. In a measurement device that does not comprise a required element, this element may be provided separately.

The predetermined signal that is injected into the signal path may e.g., be a step signal. The test signal is measured after traveling through the signal path. Then the mathematical relationship between the measured signal i.e., the step response of the signal path, and the frequency response is used to calculate said frequency response. For example, a Fourier transform may be used to calculate the frequency response for the signal path.

As a result, the actual frequency response of the signal path and a target frequency response e.g., the frequency response of an ideal signal path, are known. From these two frequency responses the frequency response needed in the second correction filter may be derived e.g., for the LF frequency range. The frequency response of the second correction filter may then be provided as the second value tuples. If the frequency response for the second correction filter is known, the filter coefficients for the second correction filter may be calculated form this frequency response. The filter coefficients may be calculated e.g., in the circuitry distortion corrector or in the measurement device, especially a processor of the measurement device.

It is understood, that the frequency range for the first value tuples and the frequency range for the second value tuples may be configurable e.g., by a user that is configuring the respective measurement application. Configuring the frequency ranges in this regard refers to determining the start and end frequency of the respective range and also the spacing between the frequencies of the single value tuples. It is understood, that specific configurations may be preset in the correction data generator.

Further embodiments of the present disclosure are subject of the further dependent claims and of the following description, referring to the drawings.

In an embodiment, the lowest of the first frequencies may be higher than the lowest of the second frequencies, and the highest of the first frequencies may be higher than the highest of the second frequencies.

The circuitry distortion corrector may use overlapping frequency ranges for the first correction filter and for the second correction filter. It is understood, that this is however not necessarily required and non-overlapping frequency ranges may be used.

With overlapping frequency ranges, the frequency range for the first correction filter is higher than the frequency range for the second correction filter. Higher in this regard refers to the lowest of the first frequencies being higher than the lowest of the second frequencies, and the highest of the first frequencies also being higher than the highest of the second frequencies. This means, that the first frequency range starts above the start frequency of the second frequency range, and ends above the end frequency of the second frequency range.

In an embodiment that uses overlapping frequency ranges, the frequency ranges may e.g., overlap by 10% e.g., of the range of the second frequency range. If for example, the second frequency range ranges from 1 Hz to 1 GHz, the first frequency range may range from 900 Hz to 10 GHz.

In another embodiment, the first correction filter may provide corrections of the filtered signals of less than 0.5 dB, or less than 0.4 dB, or less than 0.3 dB, or less than 0.2 dB, or less than 0.1 dB.

The first correction filter, as indicated above, performs filtering in the higher frequency range. In that frequency range, the distortions introduced by the signal chain are usually of minor amplitude. Consequently, the first correction filter may operate with corrections of a small amplitude like e.g., an amplitude below 0.5 dB, as indicated above.

With filters like the first correction filter that provides corrections within a predefined low amplitude range, other filters that may be used in a measurement device like e.g., anti-aliasing filters or anti-imaging filters, also called reconstruction filters, may easily be provided, since only small amounts or corrections are to be performed.

In yet another embodiment, the second correction filter may provide corrections of the filtered signals of more than 0.5 dB, or more than 0.6 dB, or more than 0.7 dB, or more than 0.8 dB, or more than 0.9 dB, or more than 1.0 dB.

The second correction filter, as indicated above, performs filtering in the lower frequency range. In that frequency range, the distortions introduced by the signal chain may be of a larger amplitude than in the higher frequency range. Consequently, the second correction filter may operate with corrections of a larger amplitude like e.g., an amplitude above 0.5 dB, as indicated above.

With filters like the second correction filter that provides corrections within a predefined higher amplitude range, the other filters that may be used in a measurement device like e.g., anti-aliasing filters or anti-imaging filters, also called reconstruction filters, may be configured accordingly.

In a further embodiment, the first circuitry characterizing values may be provided as S-parameters.

S-Parameters are also called scattering parameters and characterize an electrical circuit. In the case of the circuitry distortion corrector, the signal path between the signal source of the signal to be measured i.e., the DUT, and the measurement device is characterized by the s-parameters.

The s-parameters describe the electrical behavior of the signal path. For example, for a two-port network, the ports are numbered 1 and 2. The associated S-parameter definition is in terms of incident and reflected 'power waves', a1, b1, and a2, b2, respectively. For a generic multi-port network, the s-parameters may be provided in a matrix of the form $b=S*a$, wherein b and a are vectors comprising the 'power waves' a, b of the respective port, and wherein S is the s-parameter matrix.

With the s-parameters it is therefore possible to characterize the signal chain from the DUT to the measurement device for the respective frequency range.

For the first correction filter, the frequencies of the first value tuples are equally spaced apart i.e., the same frequency distance is present between two consecutive ones of the first frequencies, in each case.

Exemplary first value tuples for a frequency range starting from 0.5 GHz may comprise:

| # GHz | S DB | R50 |
|---|---|---|
| 0.5 | −2.5 | |
| 1.0 | −5.5 | |
| 1.5 | −3.0 | |

-continued

| # GHz | S DB | R50 |
|---|---|---|
| 2.0 | −3.2 | |
| ... | | |

Further exemplary first value tuples for a frequency range starting from 0.1 GHz may comprise:

| # GHz | S DB | R50 |
|---|---|---|
| 0.1 | −2.5 | |
| 0.2 | −2.9 | |
| 0.3 | −3.0 | |
| 0.4 | −2.8 | |
| ... | | |

In the tables # GHz refers to the frequency. S DB to the respective s-parameter in dB, and R50 indicates that the S-parameter is provided for 50 Ohms impedance.

In the above-shown tables, only the single relevant s-parameter is shown. It is understood, that more than the shown frequencies and more s-parameters may be provided.

Based on such characterizing s-parameters it is possible to calculate the first filter coefficients for the first correction filter efficiently.

In another embodiment, the first value tuples may be provided in a first touchstone file.

A touchstone file is a standardized file format that may be used to provide the s-parameters. Using such a standardized format allows exchanging the s-parameters and re-using s-parameters easily.

In a further embodiment, the second circuitry characterizing values may be provided as s-parameters.

As explained above, with the s-parameters it is possible to characterize the signal chain from the DUT to the measurement device for a given frequency range. This also applies to the frequency range of the second correction filter i.e., the lower frequency range.

For the second correction filter, the frequencies of the second value tuples are logarithmically spaced apart i.e., the frequency distance grows logarithmically between consecutive pairs of the second frequencies.

Exemplary second value tuples for a frequency range starting from 0 Hz may comprise:

| # kHz | S DB | R50 |
|---|---|---|
| 1 | −3.0 | |
| 10 | −2.1 | |
| 100 | −2.3 | |
| 1000 | −4.0 | |
| ... | | |

In the table # kHz refers to the frequency. S DB to the respective s-parameter in dB, and R50 indicates that the S-parameter is provided for 50 Ohms impedance.

In the above-shown tables, only the single relevant s-parameter is shown. It is understood, that more than the shown frequencies and more s-parameters may be provided.

Based on such characterizing s-parameters it is possible to calculate the second filter coefficients for the second correction filter efficiently.

In yet another embodiment, the second value tuples may be provided in a second touchstone file.

As explained above, a touchstone file is a standardized file format that may be used to provide the s-parameters. Using such a standardized format allows exchanging the s-parameters and re-using s-parameters easily.

In yet a further embodiment, the first touchstone file and the second touchstone file may be the same file.

It is understood, that a single touchstone file may be provided for the first and second value tuples. In such a case, the first and second value tuples may be provided in two separate sections of such a file. For example, the first value tuples may be provided after the second value tuples in the touchstone file, therefore starting with the lowest frequency. A resulting touchstone file may in an exemplary embodiment look like shown below:

| # kHz | S DB | R50 |
|---|---|---|
| 1 | −3.0 | |
| 10 | −2.1 | |
| 100 | −2.3 | |
| 1000 | −4.0 | |
| 10000 | −3.0 | |
| 100000 | −3.2 | |
| ... | | |

| # GHz | S DB | R50 |
|---|---|---|
| 0.1 | −2.5 | |
| 0.2 | −2.9 | |
| 0.3 | −3.0 | |
| 0.4 | −2.8 | |
| ... | | |

It is understood, that an indication may be provided between the second and the first value tuples that allows easily separating the first and second value tuples, when operating on a respective touchstone file.

Using touchstone files allows determining the first and second value tuples independently of the application of the circuitry distortion corrector. The touchstone files may for example be generated with dedicated measurement equipment and may then be provided to the circuitry distortion corrector. As alternative, a manufacturer of accessories for measurement devices may provide the touchstone files for the accessories e.g., when a customer buys the accessory or as a download.

It is understood, that the first and second value tuples may as alternative be stored in a proprietary file format, that may be different from the touchstone file format. Such a file format may especially be an encrypted file format that may only be decrypted by specific devices. For example, a manufacturer of the circuitry distortion corrector may provide the circuitry distortion corrector with the decryption keys for decrypting a proprietary file comprising the first and second value tuples for a specific measurement accessory. The manufacturer may therefore limit the use of the correction data he provides to specific devices.

In another embodiment, the circuitry distortion corrector may comprise a digital circuit that is coupled to the signal input and implements the first correction filter and the second correction filter.

It is understood that the digital circuit may comprise e.g., an ASIC, an FPGA, a CPLD, a DSP or the like. It is understood, that ASICs, FGPAs and CPLDs are preconfigured or configurable devices that do not continuously execute computer readable instructions but that implement a logic function in hardware in a digital device. Therefore, if an ASIC, or a FPGA, or a CPLD is used to implement the first correction filter and the second correction filter, no computer readable instructions are required, instead the configuration of an ASIC is pre-determined and the configuration of an FPGA or a CPLD may be loaded into the device during production of the device or every time during startup of the device.

It is understood, that a memory may be provided to store the first and second value tuples and that such a memory may be coupled via a respective memory interface to the digital circuit or may be integrated into the digital circuit. Further, the digital circuit may comprise a function to load the first and second value tuples from the memory and to update or upload first and second value tuples into the memory. Such an interface may e.g., be provided via a measurement device that comprises the circuitry distortion corrector. For example, an oscilloscope may comprise such an interface, e.g., in the form of a network interface for loading the value tuples from a network location, or a USB interface for loading the value tuples via a USB stick. In other embodiments, any other adequate interface may be used e.g., a memory card interface.

In case, that the digital circuit uses a device like a processor to implement the first correction filter and the second correction filter, the memory may be provided to also store the respective computer readable instructions. When executed by the processor, the instruction will cause the processor to implement the required functionality of the first and second correction filters. It is understood, that the computer readable instructions in such an embodiment may also be updated via a respective interface.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
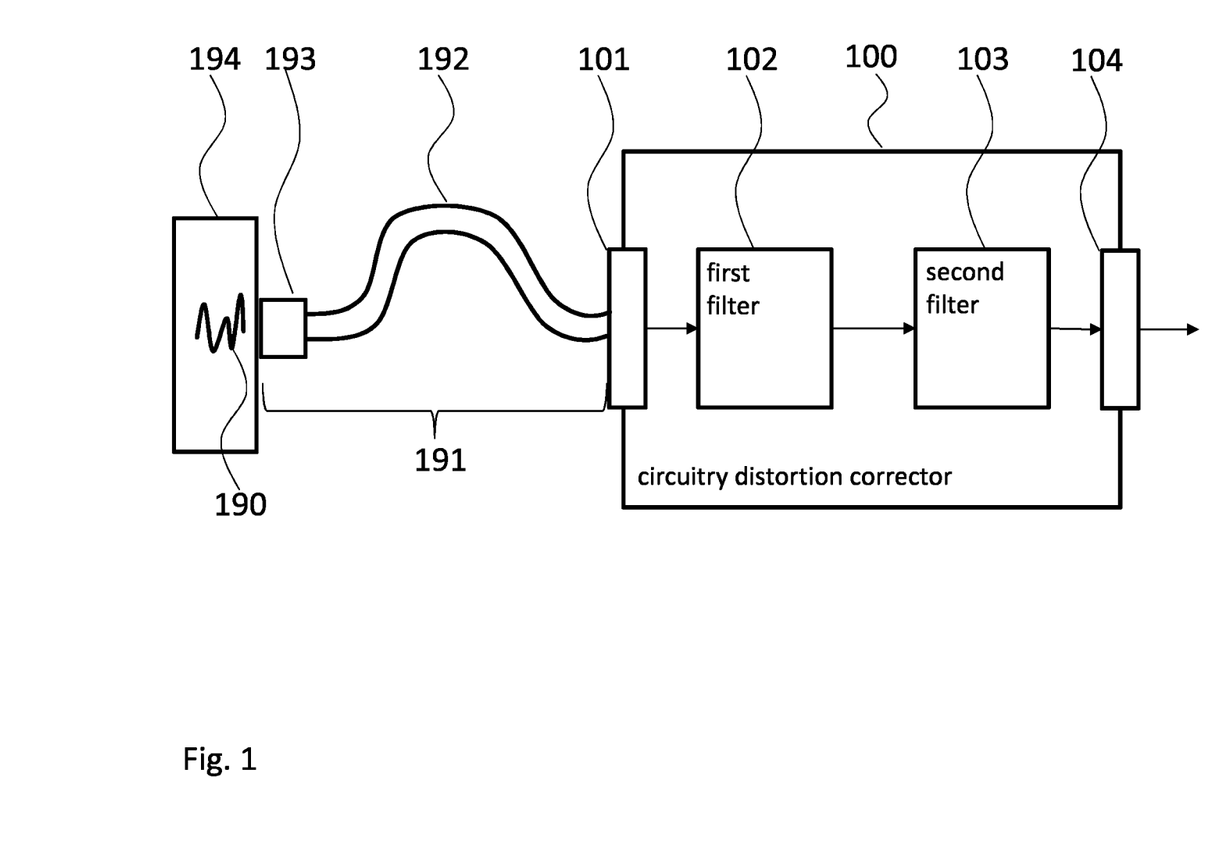
FIG. 1 shows a block diagram of an embodiment of a circuitry distortion corrector according to the present disclosure.

FIG. 1 shows a block diagram of a circuitry distortion corrector 100. The circuitry distortion corrector 100 serves for correcting distortions in signals 190 that are to be measured in a device under test, DUT, 194 via a respective electrical circuitry 191. The electrical circuitry 191 usually comprises resistances, capacitances and inductivities that influence the signal 190 on its signal path to the circuitry distortion corrector 100 and a measurement device that may use the circuitry distortion corrector 100. The effect provided by the electrical circuitry 191 may be seen as a kind of filtering effect that is unwanted in the measurement application.

In FIG. 1, the electrical circuitry 191 that couples the circuitry distortion corrector 100 to the DUT 194 comprises a cable 192, especially a coaxial cable, and a measurement probe 193. In embodiments, the probe 193 may be coupled indirectly to the DUT 194 e.g., via interposers or adaptors. The circuitry distortion corrector 100 may also correct the distortions introduced by such interposers or adaptors. It is understood, that for complex measurement operations multiple probes with respective cables may be used and that in a measurement application a circuitry distortion corrector 100 may be available for all probes. In such an embodiment, a dedicated circuitry distortion corrector 100 may be provided for every probe or a single circuitry distortion corrector 100 with multiple signal paths i.e., one for each probe, may be used. Such a circuitry distortion corrector may comprise the elements as described in the following for circuitry distortion corrector 100 for every probe.

The circuitry distortion corrector 100 serves for compensating or correcting the distortions introduced in the signal 190 by the electrical circuitry 191. To this end the circuitry distortion corrector 100 comprises a signal input 101 that receives the signal 190 via the cable 192. The signal input 101 is coupled to a first correction filter 102, and the first correction filter 102 is coupled to a second correction filter 103.

The first correction filter 102 operates based on first filter coefficients. The first filter coefficients are based on first value tuples, and each first value tuple comprises a first frequency and a respective first circuitry characterizing value. The first circuitry characterizing values may especially be s-parameters, as explained above. The first frequencies are equally spaced apart i.e., the frequency distance between the frequencies of two consecutive first value tuples is equal for all first value tuples.

The second correction filter 103 operates with second filter coefficients. The second filter coefficients are based on second value tuples, and each second value tuple comprises a second frequency and a respective second circuitry characterizing value. As well as the first circuitry characterizing values, the second circuitry characterizing values may especially be s-parameters. The second frequencies are logarithmically spaced apart i.e., the frequency distance between the frequencies of two consecutive second value tuples is increases logarithmically for the second value tuples.

The output of the second correction filter 103 is output by the circuitry distortion corrector 100 via signal output 104.

It is understood, that the first correction filter 102 and the second correction filter 103 may also be provided in parallel.

The first value tuples serve as a basis for calculating the filter coefficients of the first correction filter 102, and the second value tuples serve as a basis for calculating the filter coefficients of the second correction filter 103. To this end, the first circuitry characterizing values may be determined with a correction data generator as shown e.g., in FIG. 5.

The circuitry distortion corrector 100 may comprise a converter that converts the first value tuples i.e., the frequencies and the respective first circuitry characterizing values e.g., in the form of s-parameters, into the filter coefficients of the first correction filter 102. Such a converter may be implemented e.g., as a computer program in a processor that executes the computer readable instructions of the computer program. Such a processor may especially be a processor that is already present in a measurement device that comprises the circuitry distortion corrector 100. In another embodiment, the converter may be provided in the first correction filter 102.

The same applies to the second value tuples. The above-mentioned converter may also convert the second value tuples i.e., the frequencies and the respective second circuitry characterizing values e.g., in the form of s-parameters, into the filter coefficients of the second correction filter 103. The converter for the second correction filter 103 in analogy to the above-mentioned converter may be implemented e.g., as a computer program in a processor that executes the computer readable instructions of the computer program. Such a processor may especially be a processor that is already present in a measurement device that comprises the circuitry distortion corrector 100. In another embodiment, the converter may be provided in the second correction filter 103.

The two different correction filters 102, 103 that operate based on different value tuples operate on different frequency ranges. The first correction filter 102 operates on a higher frequency range, and the second correction filter 103 operates on a lower frequency range. The terms higher frequency range and lower frequency range refer to the frequency ranges being different but possibly overlapping. The lower frequency range will start lower than the higher frequency range and the higher frequency range will end higher than the lower frequency range.

Consequently, the first correction filter 102 serves for correcting distortions in the higher frequency range. The second correction filter 103 serves for correcting distortions in the lower frequency range. This will be explained in further detail in conjunction with FIG. 7.

The first correction filter 102 and the second correction filter 103 may be provided in a dedicated processing element, like e.g., an ASIC, an FPGA, a CPLD or the like that implement the respective logic functions in hardware. Using such a device allows implementing complex functions that require a huge processing power to compute, especially if implemented in software. The first correction filter 102 and the second correction filter 103 may also be implemented in a processing element e.g., a microcontroller, that comprises the required processing power.

The first correction filter 102 and the second correction filter 103 may at least in part also be provided as a computer program product comprising computer readable instructions that may be executed by a processing element. In a further embodiment, the first correction filter 102 and the second correction filter 103 may at least in part be provided as addition or additional function or method to the firmware or operating system of a processing element that is already present in the respective application.

Figure 2:
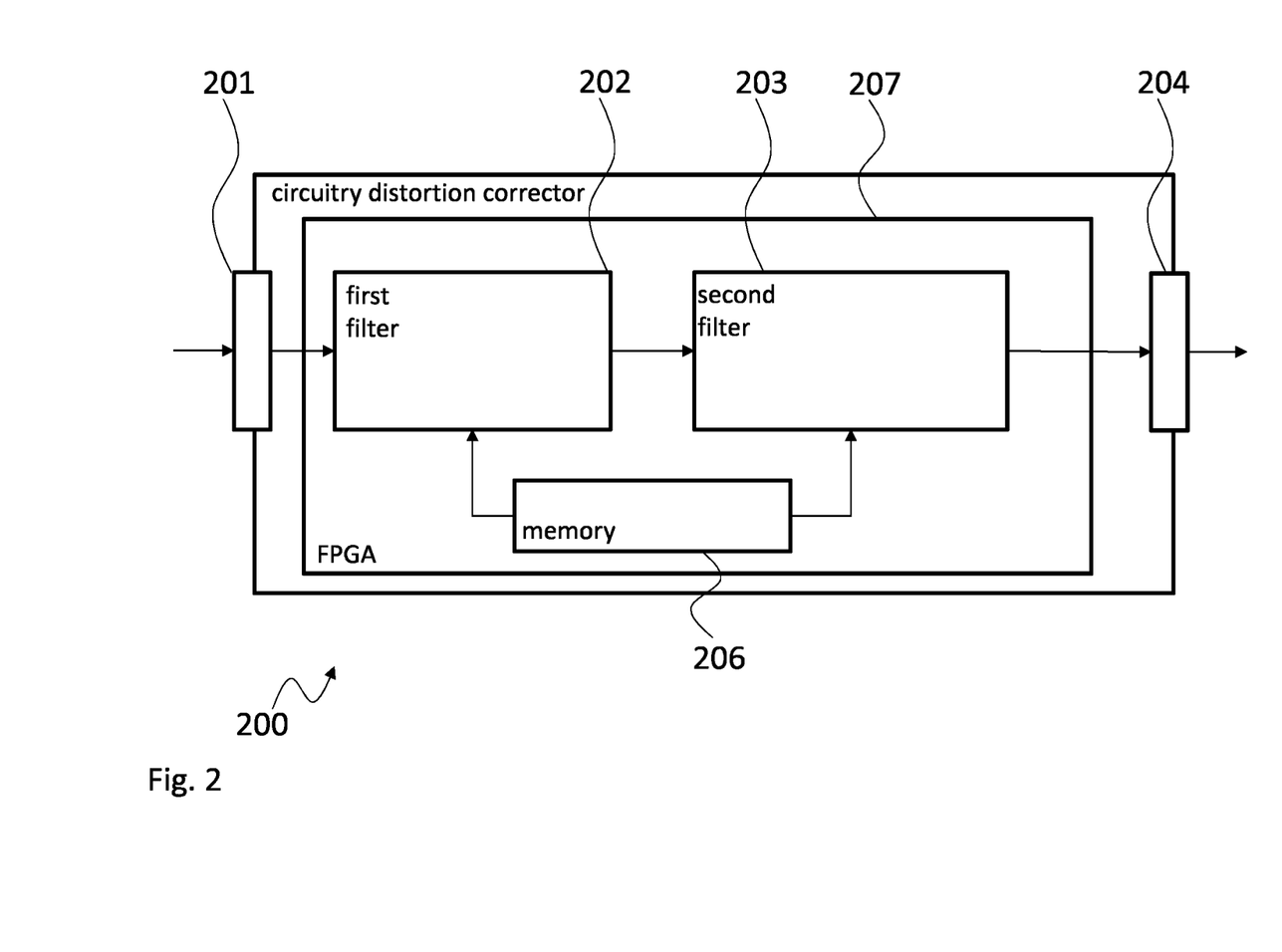
FIG. 2 shows a block diagram of another embodiment of a circuitry distortion corrector according to the present disclosure.

FIG. 2 shows a block diagram of another circuitry distortion corrector 200. The circuitry distortion corrector 200 is based on the circuitry distortion corrector 100. Therefore, the circuitry distortion corrector 200 comprises a signal input 201 that receives the signal to be measured and a signal output 204 that outputs the corrected signal.

In the circuitry distortion corrector 200 the signal input 201 is coupled to an FPGA 207. The first correction filter 202 and the second correction filter 203 are both implemented as logic functions in the FPGA 207. It is understood, that instead of an FPGA 207 an ASIC or a CPLD may also be used.

The FPGA 207 comprises a memory 206 that stores the first value tuples and the second value tuples for the first correction filter 202 and the second correction filter 203. In an embodiment, the memory 206 may store the first and second filter coefficients as calculated based on the respective value tuples.

Further, the memory 206 may also store the configuration of the FPGA 207. The FPGA 207 may store the logic functions that are to be executed on the FPGA 207 during runtime in a memory 206. The FPGA 207 may then on startup load the respective configuration and initiate operation. It is important to note, that an FPGA 207 implements logic functions in a digital hardware circuit. An FPGA 207 does not execute software instructions in a processor, unless the logic functions of a processor are configured in the FPGA 207 or an additional processor is present in the FPGA 207 device.

If an FPGA 207 with an additional processor is used in the circuitry distortion corrector 200 or a processor is configured in the FPGA 207 this processor may be used to control the first correction filter 202 and the second correction filter 203, especially to convert the value tuples comprising the circuitry characterizing values into respective filter coefficients. It is understood, that any other processor present in e.g., a measurement device that comprises the circuitry distortion corrector 200, may be used to perform these calculations.

Figure 3:
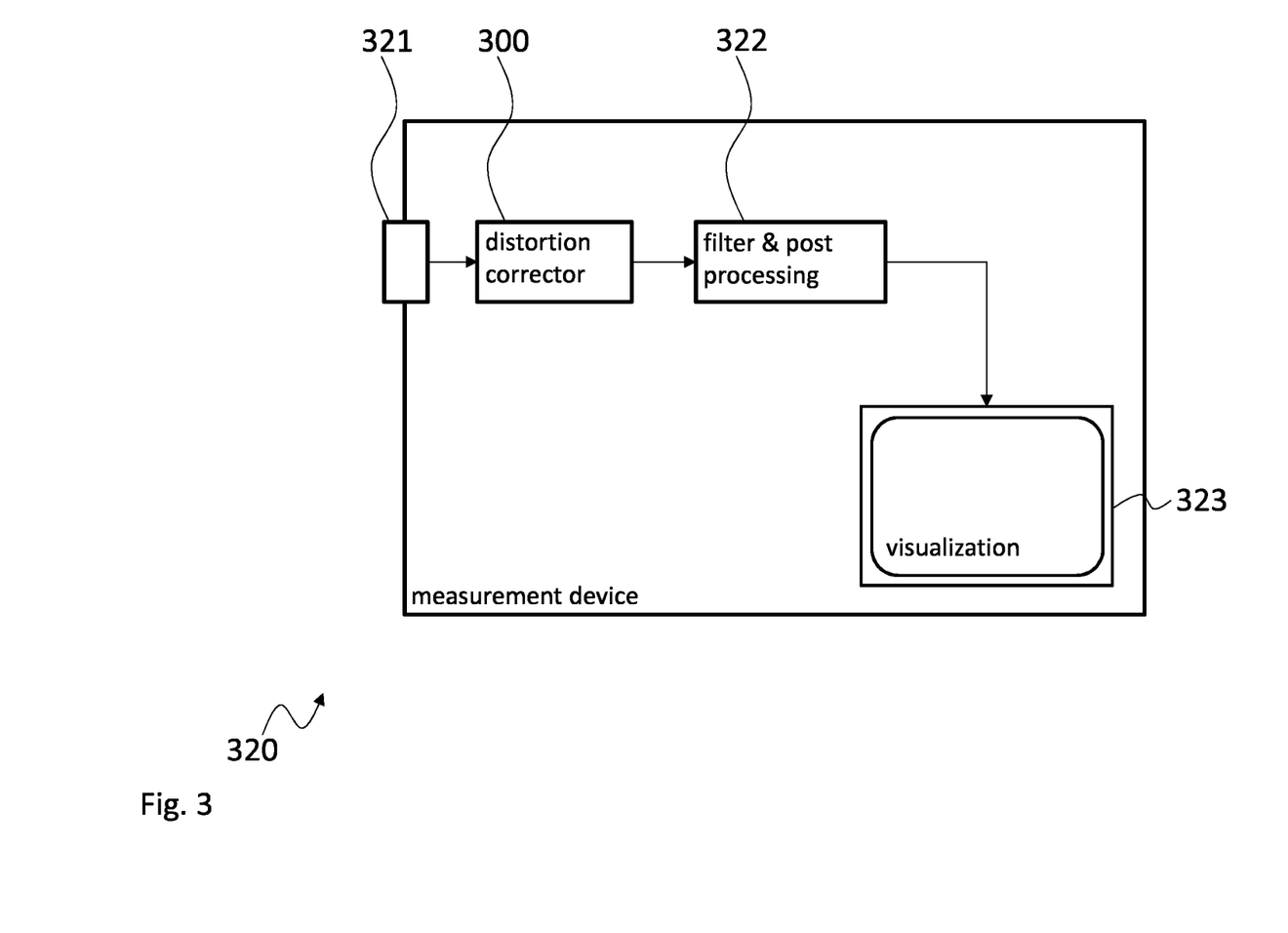
FIG. 3 shows a block diagram of an embodiment of a measurement device according to the present disclosure.

FIG. 3 shows a block diagram of a measurement device 320. The measurement device 320 may be e.g., an oscilloscope. Other types of possible measurement devices may include but are not limited to Vector Network Analyzers, VNAs. The measurement device 320 comprises a measurement interface 321 that may be connected via a cable to a probe for measuring signals in a DUT. As explained above, an interposer or adaptor may also be used to couple the probe to the DUT.

In the measurement device 320, the measurement interface 321 is coupled to the distortion corrector 300. The signal after passing through the distortion corrector 300 is provided to a filtering & post processing stage 322 of the measurement device 320. After the post processing the signal is provided to a visualization 323.

The measurement interface 321 may comprise the hardware connectors of the measurement device 320 e.g., one or more coaxial connectors for connecting one or more probes to the measurement interface 321. It is understood, that further circuitry may be provided in the measurement interface 321 or between the measurement interface 321 and the distortion corrector 300 as required. The measurement interface 321 may for example comprise attenuators, filters and amplifiers. The measurement interface 321 may also comprise an analog-to-digital converter.

The filtering & post processing stage 322 may comprise different filters and functions that are required to prepare the signal after correcting the influences of the signal path with the distortion corrector 300 for storing and displaying the signal to the user.

Figure 4:
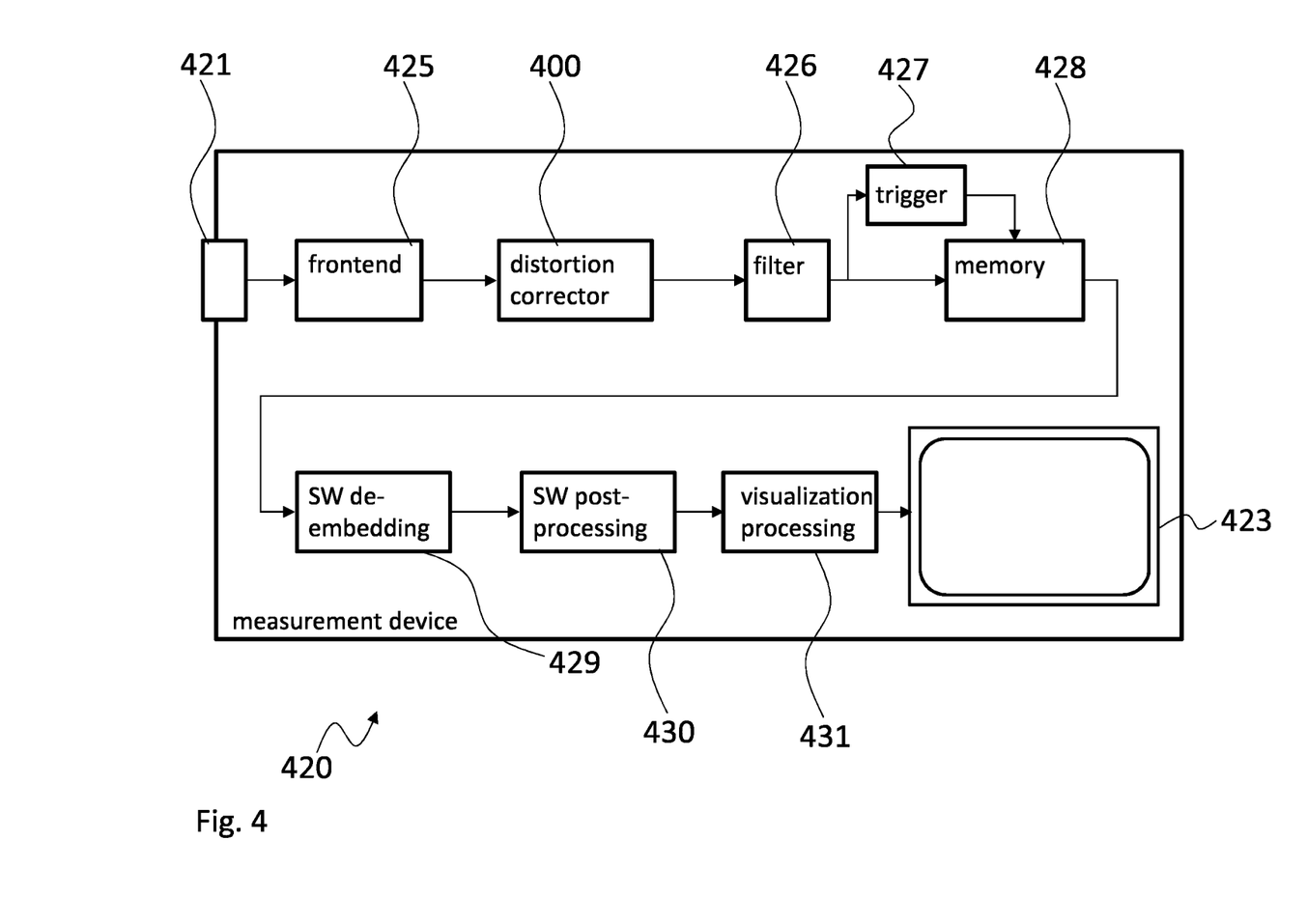
FIG. 4 shows a block diagram of another embodiment of a measurement device according to the present disclosure.

FIG. 4 shows a block diagram of another measurement device 420. The measurement device 420 is based on the measurement device 320. Therefore, the measurement device 420 comprises a measurement interface 421 that is coupled to a frontend 425. The frontend 425 is coupled to the distortion corrector 400, and the distortion corrector 400 is coupled to a filter 426 e.g., to a LF equalizer filter. The output from filter 426 is provided to a trigger 427 and a memory 428. The memory 428 stores the signal i.e., samples of the signal for later processing and display to a user. Since the memory 428 is limited, the signal may in embodiments not be stored continuously in the memory 428.

Instead, the trigger 427 is provided. The trigger 427 may be configured to monitor the signal for the occurrence of a specific event, for example for the occurrence of a specific signal level. If the trigger 427 detects the event, it triggers the memory 428 to store the signal from that moment on. It is understood, that in an embodiment, the memory 428 may continuously store the signal in a ring-buffer like memory. This means that the oldest stored values are overwritten by the newest values. Only after being triggered by the trigger 427, the memory 428 may stop overwriting at least the values stored after being triggered. The size of the memory 428 limits the number of samples that may be stored for further processing. However, with the continuous storing of signal values by the memory 428, it is possible to also provide a predetermined number of signal values for further processing that are recorded prior to triggering of the memory 428 by the trigger 427.

The measurement interface 421, the frontend 425, the distortion corrector 400, the filter 426, the trigger 427 and the memory 428 may be provided in hardware. This means that at least some of these elements may in part or fully be provided as discrete or integrated digital circuits or as configurable logic devices, like the FPGAs, ASICs or CPLDs, as explained above. It is understood, that respective supporting analog circuitry is also possible.

After storing the signals in the memory 428, the further processing of the stored signals may be performed in the software-based de-embedding 429, the software-based post-processing 430, and the visualization processing 431. These functions may e.g., be performed in a processor that executes respective computer readable instructions, that when executed cause the processor to perform the respective functions or calculations.

The software-based de-embedding 429 may provide a further de-embedding that may involve more complex calculations but that are not required to be performed in real time or prior to recording the signal values in the memory 428. The same applies to the software-based post-processing 430, which may perform any required calculations or functions on the stored signal data, that need not necessarily be performed in real time or prior to storing the signal data. The visualization processing 431 performs any conditioning of the stored signal data that is required to display the signal waveform on the visualization unit 423 e.g., on a display of the measurement device 420.

Figure 5:
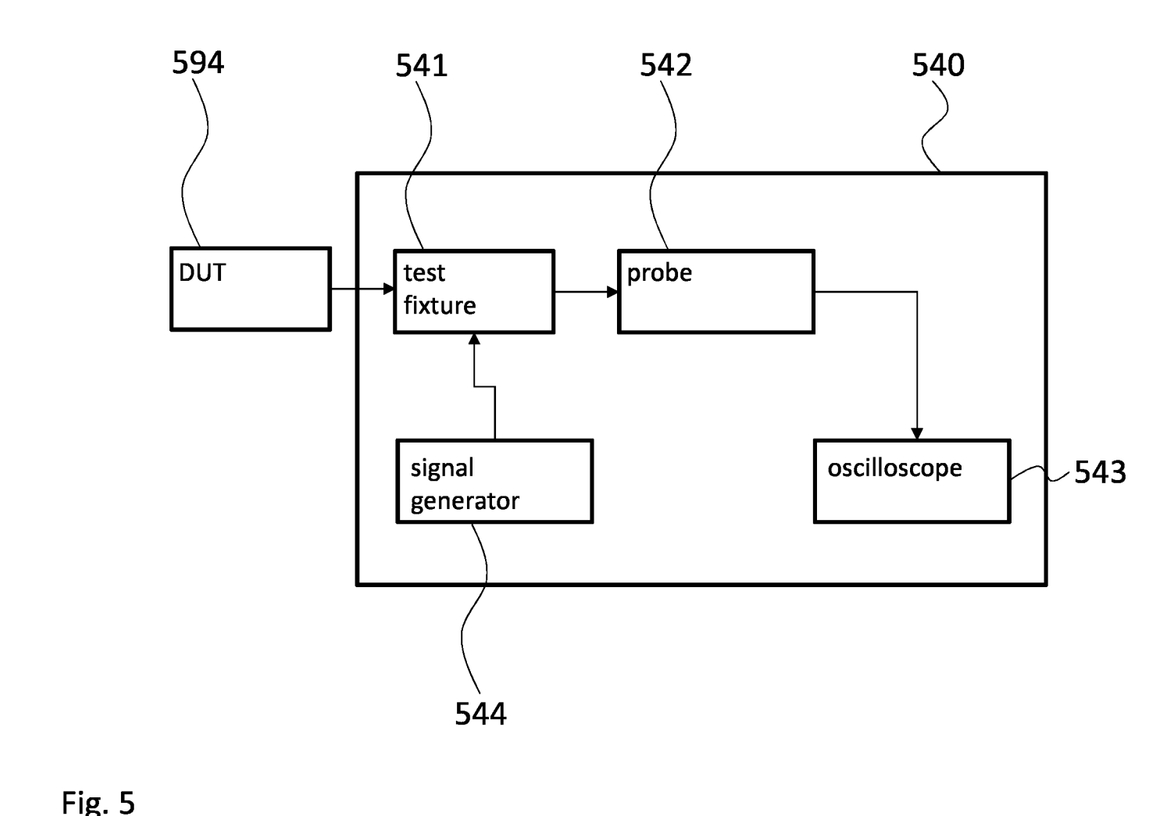
FIG. 5 shows a block diagram of an embodiment of a correction data generator according to the present disclosure.

FIG. 5 shows a block diagram of a correction data generator 540. The correction data generator 540 serves to generate the first and second value tuples that may then be used as a basis for creating the first filter coefficients and the second filter coefficients. The correction data generator 540 may measure the electrical properties of the signal path between the DUT 594 and the measurement device.

In the exemplary correction data generator 540, the signal path comprises a test fixture 541 and a probe 542. The probe 542 is connected to an oscilloscope 543. The oscilloscope 543 is not part of the signal path. Instead, the oscilloscope 543 is the device that is used to measure the electrical properties of the signal path.

The test fixture 541 may comprise any device or element that is required to perform the measurement task. Such elements may comprise e.g., adaptors or interposers that are required to couple the probe 542 to the DUT 594 or facilitate access to the pick-up point of the signal that is to be measured.

The correction data generator 540 further comprises a signal generator 544. For determining the electrical properties of the signal path, the signal generator 544 generates a predetermined signal and the oscilloscope 543 measures the predetermined signal after traveling through the signal path. Since the predetermined signal is known, the measured signal may be compared to the known predetermined signal in order to determine the electrical properties of the signal path.

The electrical properties of the signal path may be provided e.g., as s-parameters for different frequencies.

The predetermined signal may be a signal e.g., a step signal or an impulse signal, with a predetermined signal amplitude and with a predetermined rise time.

It is understood, that the correction data generator 540 is one of multiple ways of determining the value tuples for use with the first and the second correction filter.

In other embodiments, the value tuples may e.g., be determined by simulating the signal path with a respective simulation program for simulating electrical circuits. A simulation is adequate e.g., in cases where the properties of the single elements of the signal path like the probe, the cable and the connectors are already known.

For sake of clarity in the following description of the method-based FIG. 6 the reference signs used above in the description of apparatus-based FIGS. 1-5 will be maintained.

Figure 6:
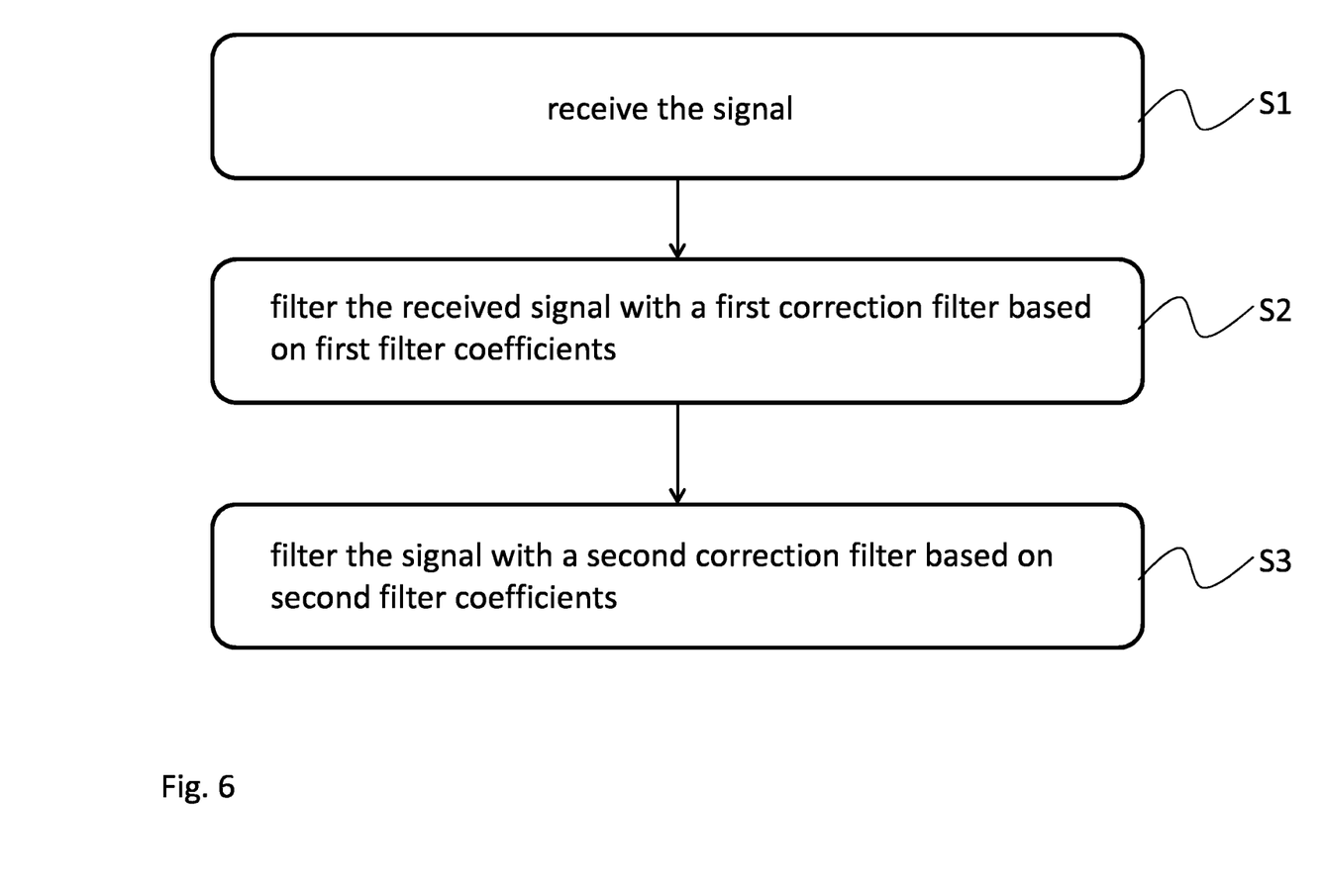
FIG. 6 shows a flow diagram of an embodiment of a method according to the present disclosure.

FIG. 6 shows a flow diagram of an embodiment of a correction method for correcting distortions of signals in electrical circuitry, especially the signal path between a DUT 194, 594 and a measurement device 320, 420.

The correction method comprises receiving S1 the signals, filtering S2 with a first correction filter 102, 202 the received signals based on first filter coefficients that are based on first value tuples, each first value tuple comprising a first frequency and a respective first circuitry characterizing value, wherein the first frequencies are equally spaced apart, and filtering S3 with a second correction filter 103, 203, 603 the signals filtered with the first correction filter 102, 202 based on second filter coefficients that are based on second value tuples, each second value tuple comprising a second frequency and a respective second circuitry characterizing value, wherein the second frequencies are logarithmically spaced apart.

The frequency range covered by the first value tuples and the frequency range covered by the second value tuples may overlap, with the first frequency range being the higher frequency range. For example, the lowest of the first frequencies may be higher than the lowest of the second frequencies, and the highest of the first frequencies may be higher than the highest of the second frequencies.

The filtering S1 with the first correction filter 102, 202 may provide corrections of the filtered signals that are adequate for the higher frequency range of e.g., less than 0.5 dB, or less than 0.4 dB, or less than 0.3 dB, or less than 0.2 dB, or less than 0.1 dB.

The filtering S2 with the second correction filter 103, 203, 603 may provide corrections of the filtered signals that are adequate for the lower frequency range of e.g., more than 0.5 dB, or more than 0.6 dB, or more than 0.7 dB, or more than 0.8 dB, or more than 0.9 dB, or more than 1.0 dB.

The first circuitry characterizing values and the second frequency characterizing values may be provided as S-parameters. In an embodiment, the first value tuples and the second value tuples may be provided in a first touchstone file.

Figure 7:
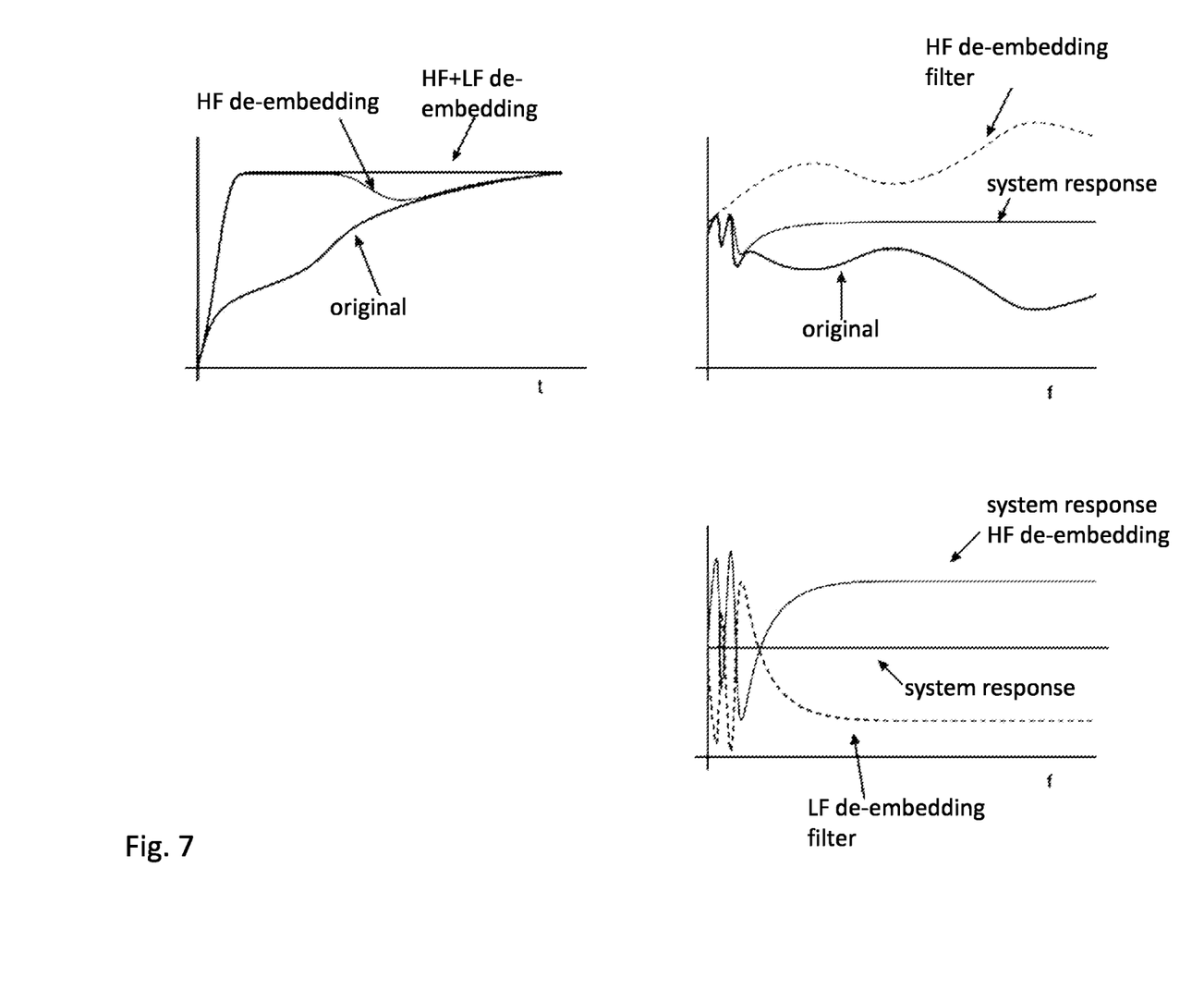
FIG. 7 shows three diagrams of a signal in the time and the frequency domain.

FIG. 7 shows three diagrams of a step signal in the time and the frequency domain. The diagram on the left shows in the time-domain a step signal after passing through a signal path (original) and after performing filtering with the first correction filter (HF de-embedding) and with the first and the second correction filter (HF+LF de-embedding).

The upper diagram on the right shows in the frequency domain the signal after passing through the signal path (original), the frequency response of the first correction filter (HF de-embedding filter) and the resulting system response (system response).

The lower diagram on the right shows in the frequency domain the signal after being filtered with the first correction filter (system response HF de-embedding), the frequency response of the second correction filter (LF de-embedding filter) and the final resulting system response (system response) after being filtered with the second correction filter.

It can be seen in the left diagram that the original signal compared to an ideal step signal has a large raise time and is deformed. After applying the first correction filter i.e., filtering in the higher frequency range, the raise time of the signal is heavily increased. However, after raising to the amplitude of the original step signal, a low frequency distortion is visible in the original signal where the signal falls and then slowly increases to the amplitude of the step signal again. After applying the second correction filter (HF+LF de-embedding) this low frequency distortion is also removed.

In the frequency domain (upper diagram) it can be seen that the frequency response of the first correction filter almost mirrors the original signal in the frequency response on a vertical line, which represents the ideal system response, in order to compensate the distortions. However, as can be seen, the frequency response of the first correction filter does not mirror the original signal in a lower frequency range.

In the lower diagram on the right, it can be seen, that the frequency response of the second correction filter (LF de-embedding filter) mirrors the original signal after being filtered by the first correction filter in the lower frequency range on the vertical line that is the ideal system response. After applying the second correction filter, the distortions in the lower frequency range are eliminated.

Figure 8:
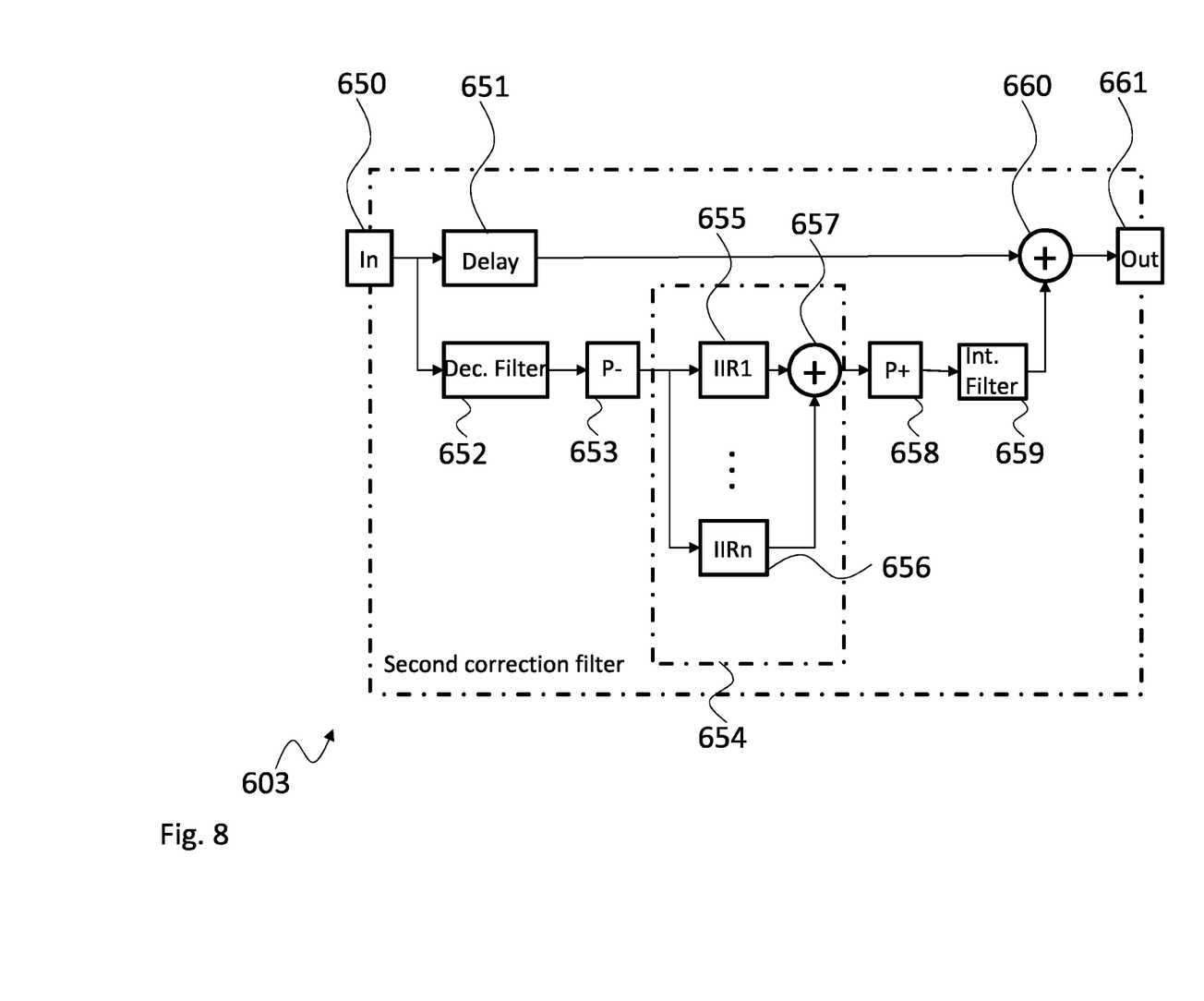
FIG. 8 shows a block diagram of an embodiment of a second correction filter.

FIG. 8 shows a block diagram of a possible embodiment of a second correction filter 603. The second correction filter 603 comprises an input 650 and an output 661 for receiving and outputting the signal to be filtered. In the second correction filter 603 a delay path and a filter path are arranged in parallel. The delay path comprises a delay 651 that is coupled to the input and on the other end to a summing block 660. The output of the summing block 660 is coupled to the output 661.

The filter path comprises a decimation filter 652 that is coupled with its input to the input 650 and with its output to a down-sampler 653. The output of the down-sampler 653 is coupled to a filter block 654. The filter block 654 comprises a parallel arrangement of multiple filters. In the second correction filter 603 two IIR filters 655, 656 are exemplarily shown and more filters are hinted at by three dots. It is understood, that the filter block 654 may comprise any number of IIR filters starting from one IIR filter. Further, it is also understood, that at least one of the filters may be provided as FIR filter. The output of all parallel filters 655, 656 is summed with summing block 657. The output of the summing block 657 is provided to an up-sampler 658. The output of up-sampler 658 is provided to an interpolation filter 659. The output of the interpolation filter 659 is provided to summing block 660. It is understood, that the down-sampler 653 and the up-sampler 658 are optional and may be omitted. If the down-sampler 653 and the up-sampler 658 are omitted, the decimation filter 652 is directly coupled to the filter block 654, and the filter block 654 is directly coupled to the interpolation filter 659.

The IIR filters 655, 656 of the second correction filter 603 may comprise IIR filters of different order e.g., of first order, second order or higher order. The decimation filter 652 may comprise a moving average filter, also called MAVF. Such a moving average filter may be implemented with a cascaded integrator-comb filter, also called CIC-filter. The CIC filter may in an embodiment comprise one or more pairs of integrators and respective comb filters. The signal to be filtered may be provided to one or more cascaded integrators followed by a down-sampler, which in turn may be followed by one or more comb sections. The CIC filter allows for a multi-rate digital signal processing-based decimation. A CIC filter comprises a decimator or interpolator and provides an efficient implementation of a moving average filter and can be used for multi-rate processing.

If a down-sampler 653 is provided in the filter block 654 the down-sampling factor of the down-sampler 653 may correspond to the packet size P of data packets or data groups of the signal to be filtered. The decimation filter 652 may provide an average value for each packet or group and provide this average value to the down-sampler 653. Further, an up-sampling factor of the up-sampler 658 may also correspond to the packet size or group size. The delay caused by delay 651 may correspond in a possible embodiment to the delay caused by the decimation filter 652 and the delay caused by the interpolation filter 659. By providing multiple parallel IIR filters 655, 656, multiple low frequency effects may be corrected by the second correction filter 603. Such low frequency effects may for instance include filter-like effects caused by inductances and capacitances in the signal path of the measurement device. More than one IIR filter provided in parallel may deal with complex distortions caused by the signal path. Infinite impulse response filters of second or higher order may be used to equalize oscillating distortions within the signal to be filtered.

The second correction filter 603 may in an embodiment be implemented in an ASIC or FPGA in order to perform a real-time filtering with the second correction filter 603. When implemented e.g., on an ASIC or in an FPGA, IIR filters require only little resources in the respective chip. Further aspects of LF correction filters, such as the second correction filters 603 discussed herein, are described in detail in U.S. Pat. No. 10,763,976, "Digital low frequency correction circuit and method for reducing low frequency disturbances within a digital signal," the disclosure of which is incorporated herein by reference in its entirety.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS

| | |
|---|---|
| 100, 200, 300, 400 | circuitry distortion corrector |
| 101, 201 | signal input |
| 102, 202 | first correction filter |
| 103, 203, 603 | second correction filter |
| 104, 204 | signal output |
| 206 | memory |
| 207 | FPGA |
| 320, 420 | measurement device |
| 321, 421 | measurement interface |
| 322 | filter & post processing |
| 323, 423 | visualization |
| 425 | frontend |
| 426 | filter |
| 427 | trigger |
| 428 | memory |
| 429 | SW de-embedding |
| 430 | SW post-processing |
| 431 | visualization processing |
| 540 | correction data generator |
| 541 | test fixture |
| 542 | probe |
| 543 | oscilloscope |
| 544 | signal generator |
| 650 | input |
| 651 | delay |
| 652 | decimation filter |
| 653 | down-sampler |
| 654 | filter block |
| 655 | IIR filter |
| 656 | IIR Filter |
| 657 | sum |
| 658 | up-sampler |
| 659 | interpolation filter |
| 660 | sum |
| 661 | output |
| 190 | signal |
| 191 | electrical circuitry |
| 192 | cable |
| 193 | probe |
| 194, 594 | DUT |
| S1, S2, S3 | method steps |

What is claimed is:

1. A circuitry distortion corrector for correcting distortions of signals in electrical circuitry, the circuitry distortion corrector comprising:
a signal input configured to receive the signals;
a first correction filter that is coupled to the signal input and configured to filter the received signals; and
a second correction filter that is coupled to the first correction filter and configured to filter the signals that are filtered by the first correction filter;
wherein the first correction filter is configured to operate based on first filter coefficients that are based on first value tuples, each first value tuple comprising a first frequency and a respective first circuitry characterizing value, wherein the first frequencies are equally spaced apart; and
wherein the second correction filter is configured to operate with second filter coefficients that are based on second value tuples, each second value tuple comprising a second frequency and a respective second circuitry characterizing value, wherein the second frequencies are logarithmically spaced apart.

2. The circuitry distortion corrector according to claim 1, wherein the lowest of the first frequencies is higher than the lowest of the second frequencies, and wherein the highest of the first frequencies is higher than the highest of the second frequencies.

3. The circuitry distortion corrector according to claim 1, wherein the first correction filter is configured to provide corrections of the filtered signals of less than 0.5 dB, or less than 0.4 dB, or less than 0.3 dB, or less than 0.2 dB, or less than 0.1 dB.

4. The circuitry distortion corrector according to claim 1, wherein the second correction filter is configured to provide corrections of the filtered signals of more than 0.5 dB, or more than 0.6 dB, or more than 0.7 dB, or more than 0.8 dB, or more than 0.9 dB, or more than 1.0 dB.

5. The circuitry distortion corrector according to claim 1, wherein the first circuitry characterizing values are provided as S-parameters.

6. The circuitry distortion corrector according to claim 5, wherein the first value tuples are provided in a first touchstone file.

7. The circuitry distortion corrector according to claim 6, wherein the second circuitry characterizing values are provided as S-parameters.

8. The circuitry distortion corrector according to claim 7, wherein the second value tuples are provided in a second touchstone file.

9. The circuitry distortion corrector according to claim 1, wherein the first circuitry characterizing values are provided as S-parameters, the second circuitry characterizing values are provided as S-parameters, and the first value tuples and the second value tuples are provided in the same touchstone file.

10. The circuitry distortion corrector according to claim 1, further comprising a digital circuit that is coupled to the signal input and configured to implement the first correction filter and the second correction filter.

11. A correction data generator for generating correction data for use with a circuitry distortion corrector according to claim 1, the correction data generator comprising:
a measurement device;
a measurement circuitry that is coupled on a first end to the measurement device for coupling on a second end to a device under test; and
a signal generator that is coupled to the second end of the measurement circuitry;
wherein the signal generator is configured to provide a predetermined signal to the measurement circuitry and the measurement device is configured to measure the resulting signal at the first end of the measurement circuitry; and
wherein the measurement device is configured to determine the first value tuples comprising the first frequency and the respective first circuitry characterizing value, and the second value tuples comprising the second frequency and the respective second circuitry characterizing value.

12. The correction data generator according to claim 11, wherein the predetermined signal is a step signal, and wherein the measurement device is configured to determine a step response of the measurement circuitry.

13. The correction data generator according to claim 11, wherein the predetermined signal is a pulse signal, and wherein the measurement device is configured to determine a pulse response of the measurement circuitry.

14. A measurement device for measuring signals in a device under test, the measurement device comprising:
a signal input interface that is couplable to a measurement circuitry for coupling to the device under test; and
a circuitry distortion corrector that is coupled to the signal input interface to correct distortions introduced by the measurement circuitry into the signals to be measured;
the circuitry distortion corrector comprising:
a signal input configured to receive the signals;
a first correction filter that is coupled to the signal input and configured to filter the received signals; and
a second correction filter that is coupled to the first correction filter and configured to filter
the signals that are filtered by the first correction filter,
wherein the first correction filter is configured to operate based on first filter coefficients that are based on first value tuples, each first value tuple comprising a first frequency and a respective first circuitry characterizing value, wherein the first frequencies are equally spaced apart, and
wherein the second correction filter is configured to operate with second filter coefficients that are based on second value tuples, each second value tuple comprising a second frequency and a respective second circuitry characterizing value, wherein the second frequencies are logarithmically spaced apart.

15. A correction method for correcting distortions of signals in electrical circuitry, the correction method comprising:
receiving the signals;
filtering with a first correction filter the received signals based on first filter coefficients that are based on first value tuples, each first value tuple comprising a first frequency and a respective first circuitry characterizing value, wherein the first frequencies are equally spaced apart; and
filtering with a second correction filter the signals filtered with the first correction filter based on second filter coefficients that are based on second value tuples, each second value tuple comprising a second frequency and a respective second circuitry characterizing value, wherein the second frequencies are logarithmically spaced apart.

16. The correction method according to claim 15, wherein the lowest of the first frequencies is higher than the lowest of the second frequencies, and wherein the highest of the first frequencies is higher than the highest of the second frequencies.

17. The correction method according to claim 15, wherein the filtering with the first correction filter provides corrections of the filtered signals of less than 0.5 dB, or less than 0.4 dB, or less than 0.3 dB, or less than 0.2 dB, or less than 0.1 dB.

18. The correction method according to claim 15, wherein the filtering with the second correction filter provides corrections of the filtered signals of more than 0.5 dB, or more than 0.6 dB, or more than 0.7 dB, or more than 0.8 dB, or more than 0.9 dB, or more than 1.0 dB.

19. The correction method according to claim 15, wherein the first circuitry characterizing values are provided as S-parameters.

20. The correction method according to claim 19, wherein the first value tuples are provided in a first touchstone file.

21. The correction method according to claim 20, wherein the second circuitry characterizing values are provided as S-parameters.

22. The correction method according to claim 21, wherein the second value tuples are provided in a second touchstone file.

23. The correction method according to claim 15, wherein the first circuitry characterizing values are provided as S-parameters, the second circuitry characterizing values are provided as S-parameters, and the first value tuples and the second value tuples are provided in the same touchstone file.

24. The correction method according to claim 15, wherein filtering is performed in a digital circuit that implements the first correction filter and the second correction filter.

* * * * *